(12) United States Patent
Booth et al.

(10) Patent No.: US 8,297,008 B2
(45) Date of Patent: Oct. 30, 2012

(54) SYSTEM AND METHOD FOR ATTACHING A SOLAR MODULE TO A SUBSTRATE

(75) Inventors: Dennis Booth, Grass Lake, MI (US); Timothy O'Neil, Clark Lake, MI (US)

(73) Assignee: ADCO Products, Inc., Michigan Center, MI (US)

( * ) Notice: Subject to any disclaimer, the term of this patent is extended or adjusted under 35 U.S.C. 154(b) by 118 days.

(21) Appl. No.: 12/935,842

(22) PCT Filed: Apr. 2, 2009

(86) PCT No.: PCT/US2009/039315
§ 371 (c)(1),
(2), (4) Date: Sep. 30, 2010

(87) PCT Pub. No.: WO2009/124194
PCT Pub. Date: Oct. 8, 2009

(65) Prior Publication Data
US 2011/0024050 A1    Feb. 3, 2011

Related U.S. Application Data

(60) Provisional application No. 61/041,749, filed on Apr. 2, 2008.

(51) Int. Cl.
*E04C 1/00* (2006.01)
*E04F 13/08* (2006.01)
*E04B 2/00* (2006.01)
*A47G 1/17* (2006.01)
*A47G 29/00* (2006.01)

(52) U.S. Cl. ..... 52/173.3; 52/309.3; 52/390; 52/506.05; 52/DIG. 16; 248/205.3; 248/205.4; 248/683

(58) Field of Classification Search ............... 52/173.3, 52/309.3, 390, 551, 506.05, 746.1, DIG. 16, 52/786.13; 428/354, 34; 248/205.3, 205.4, 248/683
See application file for complete search history.

(56) References Cited

U.S. PATENT DOCUMENTS

| | | | |
|---|---|---|---|
| 2,484,060 A | 10/1949 | Wing | |
| 3,525,720 A | 8/1970 | Wismer et al. | |
| 4,818,610 A | 4/1989 | Zimmerman et al. | |
| 4,973,497 A | 11/1990 | Cervellati et al. | |
| 5,204,408 A | 4/1993 | Konno et al. | |
| 5,242,727 A | 9/1993 | Briddell et al. | |
| 5,368,957 A | 11/1994 | Kozmik et al. | |
| 5,429,591 A | 7/1995 | Yamamoto et al. | |
| 5,505,788 A | 4/1996 | Dinwoodie | |
| 5,507,880 A | 4/1996 | Ishikawa et al. | |
| 5,521,227 A | 5/1996 | Palazzotto et al. | |
| 5,746,839 A | 5/1998 | Dinwoodie | |
| 6,061,978 A * | 5/2000 | Dinwoodie et al. | 52/173.3 |
| 6,201,179 B1 | 3/2001 | Dalacu | |
| 6,308,485 B1 * | 10/2001 | Blumenthal | 52/468 |
| 6,384,315 B1 | 5/2002 | Yamagishi et al. | |
| 6,391,974 B1 | 5/2002 | Ogawa et al. | |

(Continued)

*Primary Examiner* — Brian Glessner
*Assistant Examiner* — Omar Hijaz
(74) *Attorney, Agent, or Firm* — Vivacqua Law, PLLC; Raymond J. Vivacqua

(57) ABSTRACT

A spacer used to secure a solar module to a substrate having surface irregularities or unevenness includes a spacer layer located between two adhesive layers. The spacer has a thickness greater than any anticipated irregularities or unevenness on the surface of the substrate. The spacer is comprised of materials that provide sufficient strength and weatherability.

13 Claims, 2 Drawing Sheets

U.S. PATENT DOCUMENTS

Figure 1:
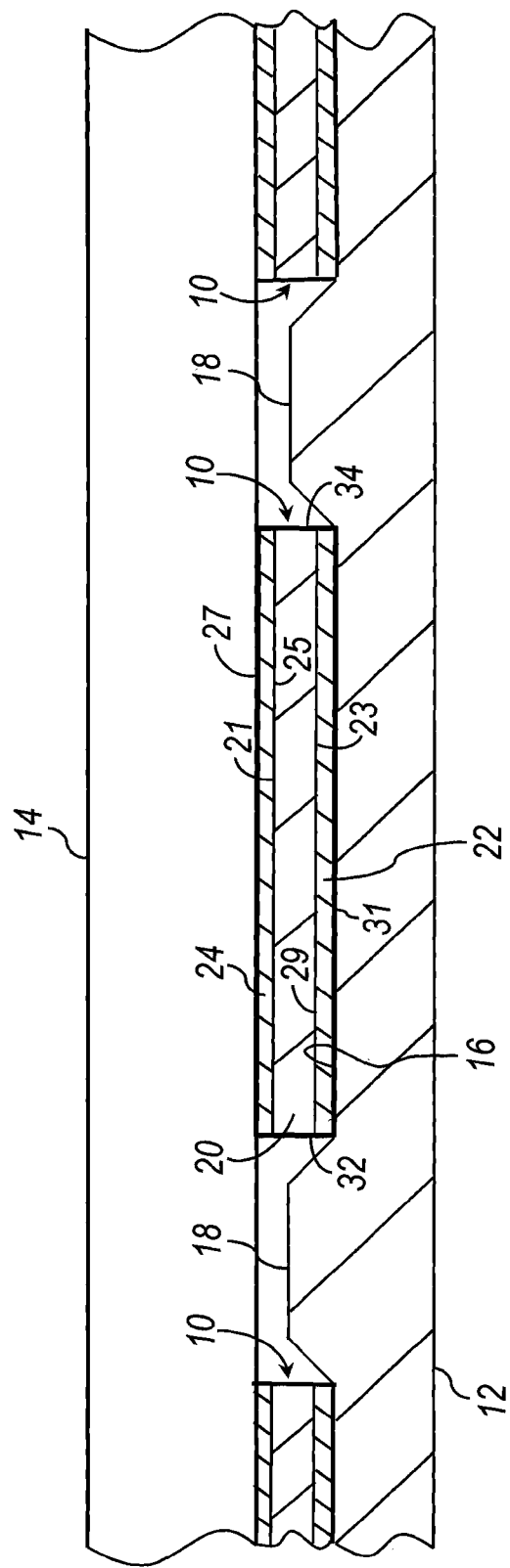

| | | |
|---|---|---|
| 6,495,159 B2 | 12/2002 | Hirano et al. |
| 6,613,172 B1 | 9/2003 | Tsujimoto et al. |
| 6,673,997 B2 | 1/2004 | Blieske et al. |
| 6,828,020 B2 | 12/2004 | Fisher et al. |
| 7,449,629 B2 | 11/2008 | Ferri et al. |
| 7,666,466 B2 | 2/2010 | Gumm |
| 7,818,922 B2 * | 10/2010 | Ellis ................................ 52/95 |
| 2005/0246972 A1 * | 11/2005 | Polumbus et al. ............. 52/90.1 |
| 2006/0020067 A1 | 1/2006 | Brant et al. |
| 2007/0047099 A1 | 3/2007 | Clemens et al. |
| 2007/0203297 A1 | 8/2007 | Wakabayashi et al. |
| 2008/0121267 A1 | 5/2008 | Stevenson et al. |
| 2008/0314434 A1 * | 12/2008 | Khouri et al. ................ 136/245 |
| 2009/0235972 A1 | 9/2009 | Fukushima et al. |
| 2009/0250109 A1 | 10/2009 | Hasegawa |
| 2009/0288697 A1 | 11/2009 | Shimizu et al. |
| 2010/0032000 A1 | 2/2010 | Yoshimine |
| 2010/0059098 A1 | 3/2010 | Beernink et al. |
| 2010/0151238 A1 | 6/2010 | Burmeister et al. |
| 2010/0200048 A1 | 8/2010 | Taruno et al. |
| 2010/0205877 A1 | 8/2010 | Varde et al. |
| 2010/0236541 A1 * | 9/2010 | Smith et al. ................... 126/621 |

\* cited by examiner

SYSTEM AND METHOD FOR ATTACHING A SOLAR MODULE TO A SUBSTRATE

CROSS-REFERENCE TO RELATED APPLICATIONS

This application claims the benefit of U.S. Provisional Application No. 61/041,749, filed on Apr. 2, 2008. The disclosure of the above application is incorporated herein by reference.

FIELD

The present invention relates to a system and method for attaching a solar module to a substrate, and more particularly to a self-adhering spacer used to attach a solar module to an uneven roofing substrate.

BACKGROUND

Photovoltaic solar panels or modules generally include a photovoltaic cell that is laminated and/or sandwiched between a plurality of substrates. The majority of photovoltaic cells are rigid wafer-based crystalline silicon cells or thin film modules having cadmium telluride (Cd—Te), amorphous silicon, or copper-indium-diselenide ($CuInSe_2$) deposited on a substrate. The thin film photovoltaic modules may be either rigid or flexible. Flexible thin film cells and modules are created by depositing the photoactive layer and any other necessary layers on a flexible substrate. Photovoltaic cells are connected electrically to one another and to other solar panels or modules to form an integrated system.

Photovoltaic modules may be installed directly onto a roofing substrate of a building. However, many roofing substrates are not flat over an area large enough to support the photovoltaic module. The unevenness or irregularity of the roofing substrate may arise due to design features of the roofing materials, such as stiffening ribs, fasteners or other protrusions, that are necessary components of the roofing substrate. Unevenness of the roofing substrate may also arise from secondary operations such as coatings applied to existing roofing materials to extend the life of the roof or to comply with environmental initiatives. An uneven or irregular roofing substrate may make it difficult to properly attach the photovoltaic module to the roofing substrate and create undesirable stress points on the photovoltaic module.

Accordingly, there is a need in the art for a self-adhering spacer operable to secure a solar module to an uneven roofing substrate. Moreover, the spacer must meet weatherability and strength criteria, such as resistance to ultra-violet radiation exposure, freeze and thaw cycles, rain, snow, sleet, and hail exposure, wind uplift forces, and extremes in temperature.

SUMMARY

The present invention provides a spacer used to attach a solar module to a substrate having surface irregularities or unevenness. The spacer includes a spacer layer and two adhesive layers on opposite sides of the spacer layer. The spacer has a thickness greater than any anticipated irregularities or unevenness on the surface of the substrate. The spacer is comprised of materials that provide sufficient strength and weatherability.

In one example of the present invention, an assembly for securing a solar module to a roofing substrate is provided. The roofing substrate includes at least one pair of parallel, spaced apart ridges. The assembly includes a spacer having a top surface and a bottom surface. The spacer has a first dimension less than a distance between one of the pair of ridges and the other of the pair of ridges and the spacer has a second dimension greater than a distance between a bottom of the at least one pair of ridges and a top of the at least one pair of ridges. A first adhesive layer includes a first surface and a second surface. The first surface is in contact with at least a portion of the top surface of the spacer and the second surface is in contact with at least a portion of the solar module. A second adhesive layer includes a first surface and a second surface. The first surface is in contact with at least a portion of the bottom surface of the spacer and the second surface is in contact with at least a portion of the roofing substrate. The assembly is disposed between the at least one pair of ridges to adhere the solar module to the roofing substrate.

In another example of the present invention, the first dimension is measured perpendicularly between a first side surface of the spacer and a second side surface of the spacer.

In yet another example of the present invention, the second dimension is measured perpendicularly between the top surface and the bottom surface of the spacer.

In yet another example of the present invention, the first adhesive layer fully covers the top surface of the spacer and the second adhesive layer fully covers the bottom surface of the spacer.

In yet another example of the present invention, the second adhesive layer is adhered to the substrate and the first adhesive layer is adhered to the solar module.

In yet another example of the present invention, the spacer is comprised of at least one of ethylene propylene diene terpolymer, polypropylene, or a polyvinyl chloride.

In yet another example of the present invention, the first and second adhesive layers have a composition that comprises an uncured robbery polymer blend, at least one tackifier or a curing agent blend, and a polybutene homopolymer.

In yet another example of the present invention, the first and second adhesive layers comprise an uncured rubbery polymer blend present in an amount from about 10% to about 60% by weight, at least one of a compatible tackifier present in an amount from about 5% to about 25% by weight or a curing agent blend present in an amount from about 1% to about 5% by weight, the compatible tackifier comprising a phenolic tackifier resin, the curing agent blend comprising at least one of a cure accelerator, a sulfur activator, and a curing vulcanizing agent, and a polybutene homopolymer present in an amount from about 20% to about 60% by weight.

In yet another example of the present invention, the spacer includes release liners removably secured to the adhesive layers.

Further areas of applicability will become apparent from the description provided herein. It should be understood that the description and specific examples are intended for purposes of illustration only and are not intended to limit the scope of the present disclosure.

DRAWINGS

Figure 2:
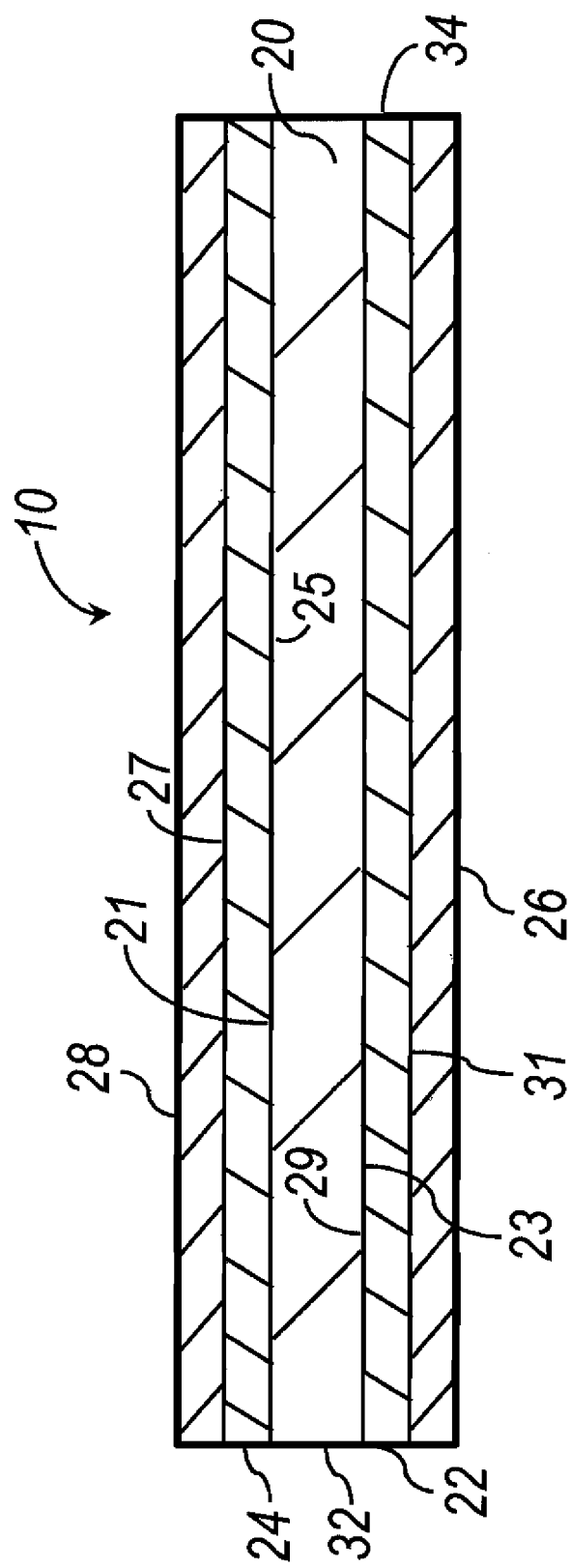

FIG. 1 is a cross-sectional view of an embodiment of a spacer according to the principles of the present invention located between an exemplary roofing substrate and an exemplary solar module; and FIG. 2 is a cross-sectional view of an embodiment of a spacer according to the principles of the present invention.

DETAILED DESCRIPTION

The following description is merely exemplary in nature and is not intended to limit the present disclosure, application, or uses.

With reference to FIG. 1, a spacer 10 according to the principles of the present invention is illustrated in use with an exemplary substrate 12 and an exemplary solar module 14. The spacer 10 is operable to attach the solar module 14 to the substrate 12, as will be described in further detail below. The substrate 12 is preferably a roof of a building, though other substrates may be employed without departing from the scope of the present invention. The substrate 12 may be comprised of various compositions, such as, for example, an ethylene propylene diene terpolymer (EPDM), a thermoplastic olefin (TPO), a polyvinyl chloride (PVC), a styrene-butadiene-styrene (SBS) modified bitumen, atactic polypropylene (APP) modified bitumen, galvanized steel, aluminum, stainless steel, and painted steel that includes polyvinylidene fluoride (PVDF), i.e. Kynar™ coated steel. The substrate 12 includes an outer surface 16 having one or more irregularities 18. In the example provided, the irregularities 18 are regularly spaced, parallel, longitudinal ribs or ridges that extend over a portion of the substrate 12, however, various other kinds of irregularities in the outer surface 16 may be present, including fasteners, other protrusions, and any other uneven surface contours.

The solar module 14 may take various forms without departing from the scope of the present invention and generally includes at least one photovoltaic cell (not shown) attached to a backing substrate (not shown). Exemplary photovoltaic cells for use with the present invention include, but are not limited to, thin film cells with a layer of cadmium telluride (Cd—Te), amorphous silicon, or copper-indium-diselenide ($CuInSe_2$) or crystalline silicon wafers embedded in a laminating film or gallium arsenide deposited on germanium or another substrate. The photovoltaic cell is operable to generate an electrical current from sunlight striking the photovoltaic cell. The backing substrate may be comprised of any number of materials selected for their strength and weatherability.

Turning to FIG. 2, the spacer 10 includes a spacer layer 20, a first adhesive layer 22, a second adhesive layer 24, a first release line 26, and a second release liner 28. The spacer layer includes a top surface 21 and a bottom surface 23 disposed opposite the top surface 21. The spacer layer 20 is a solid or semi-solid material that is firm enough to support the solar module 14 and exhibits enough resistance to compression to ensure adequate contact of the solar module 14 to the second adhesive layer 24 during rolling or pressing of the solar module 14 onto the spacer 10 during installation. The spacer layer 20 must also provide long term resistance to environmental exposure, exhibit adequate adhesive characteristics when used with the adhesive layers 22, 24, be strong enough to provide resistance to mechanical forces such as uplift forces due to wind, and flexible enough to allow the bottom surface 23 nearest the substrate 12 to conform to irregularities in the outer surface 16. The spacer layer 20 preferably comprises a material selected from the group consisting of EPDM, polypropylene, or PVC. However, the spacer layer 20 may comprise alternative compositions that exhibit the desired properties, such as, for example, polyethylene, nitrile rubber, ethylene vinyl acetate, polystyrene, butyl rubber, neoprene rubber, silicone, or block copolymer. The spacer layer 20 is preferably a foamed composition; however, corrugated or solid slab profiles may also be employed without departing from the scope of the present invention.

The first and second adhesive layers 22, 24 are located on opposite sides of the spacer layer 20. The adhesive layers 22, 24 are operable to adhere to the substrate 12 and to the solar module 14. The first adhesive layer 22 includes a first surface 25 and a second surface 27 opposite the first surface 25. The first surface 25 of the first adhesive layer 22 is in contact with the top surface 21 of the spacer layer 20 and the second surface 27 of the first adhesive layer 22 is in contact with the solar module 14. The second adhesive layer 24 includes a first surface 29 and a second surface 31 opposite the first surface 29. The first surface 29 of the second adhesive layer 24 is in contact with the bottom surface 25 of the spacer layer 20 and the second surface 31 of the second adhesive layer 24 is in contact with the roofing substrate 12.

The adhesive layers 22, 24 must be comprised of a composition that is able to adhere to the various kinds of substrates 12 and solar modules 14 described above while exhibiting necessary weatherability and strength criteria, such as resistance to ultra-violet radiation exposure, to freeze and thaw cycles, to rain, snow, sleet, and hail exposure, to wind uplift forces, and to extremes in temperature. An exemplary composition is provided below:

| | Chemical Type | Function | Range Wt % | Weight % |
|---|---|---|---|---|
| 1 | Paraffinic Process Oil | Plasticizer | 1-5 | 1.87% |
| 2 | Calcium Carbonate | Filler, rheology adjustment | 1-5 | 2.50% |
| 3 | Calcium Oxide | Water scavenger | 2-8 | 4.95% |
| 4 | Tetrakismethylene(3,5-di-t-butyl-4-hydroxyhydrocinnamate)methane | Antioxidant | 0.1-0.5 | 0.30% |
| 5 | Polybutene Homopolymer | Tackifier, adhesion promoter | 20-60 | 40.66% |
| 6 | Talc | Filler, rheology modifier | 0-5 | 2.47% |
| 7 | Phenolic Tackifier Resin | Tackifier | 5-25* | 10.11% |
| 8 | Polyisobutylene | Polymer, imparts strength and adhesion | 0-10 | 4.35% |
| 9 | Fumed Silica | Rheology modifier | 0-3 | 0.50% |
| 10 | Carbon Black | Colorant, UV absorber | 2-5 | 2.47% |
| 11 | Ethylene Propylene Dicyclopentadiene or NorbornadieneTerpolymer | Polymer, imparts strength and adhesion | 1-5 | 2.18% |
| 12 | Ethylene Propylene Ethylidenenorbornene Terpolymer | Polymer, imparts strength and adhesion | 2-10 | 8.67% |
| 13 | Polyisobutylene | Polymer, imparts strength and adhesion | 2-10 | 4.95% |
| 14 | Curing Agent Blend (Consisting of the following) | | 1.5-5* | 2.35% |
| | Tetramethylthiuram disulfide | Cure accelerator | | 0.18% |
| | Benzothiazyl disulfide | Cure accelerator | | 0.20% |
| | Zinc oxide | Sulfur activator | | 1.27% |
| | Sulfur | Curing/vulcanizing agent | | 0.34% |

-continued

| Chemical Type | Function | Range Wt % | Weight % |
| --- | --- | --- | --- |
| 15 Tetrachloro-p-benzoquinone | Stabilizer | 0.1-0.5 | 0.15% |
| 16 Chlorobutyl Rubber | Polymer, imparts strength and adhesion, crosslinking portion of polymer | 5-25 | 11.88% |
| | | | 100.00% |

Exemplary components
1. Procoil 8240/Sunpar 2280
2. Armco 70
3. Mississippi Lime
4. BNX/Irganox 1010
5. H-300 Poly
6. Mistron
7. 29095 Durez, or other commercially available tackifier
8. SDG-8650
9. HiSil 233
10. Corax N-650
11. Trilene 65 or 67, or SDG-8650 Polyisobutylene
12. Nordel IP-4520
13. Efrolen P-85
14. BL/GRN Cure Blend
15. Vulklor
16. Exxpro 3433 or Lanxess 2030
*It is allowable that indgedients 7 or 14 be omitted as long as the other is present (non-zero)

The release liners 26, 28 are attached to the adhesive layers 22, 24 and are operable to protect the adhesive layers 22, 24 during transportation and handling of the spacer 10. The release liners 26, 28 are operable to be removed from the adhesive layers 22, 24 prior to application of the spacer 10. The spacer layer 20 has a first dimension or width tailored to the specific application in which it is to be applied. The first dimension is measured perpendicularly between a first side 32 of the spacer layer 20 and a second side 34 of the spacer layer 20. For example, in the embodiment provided the spacer layer 20 has a width approximately equal to a distance between the irregularities 18 on the substrate 12. However, the width of the spacer layer 20 is preferably less than or equal to the distance between adjacent, spaced apart irregularities 18. The length of the spacer 10 may also be tailored to the application, and for example may be provided in long rolled sheets. The spacer layer 20 has a second dimension or height or thickness that is also tailored to the application. The height is measured perpendicularly between the top surface 21 and the bottom surface 23 of the spacer layer 20. The height is preferably greater than any anticipated unevenness in the substrate 12. For example, in the embodiment provided the spacer layer 20 has a height measured from the top surface 21 to the bottom surface 23 that is greater than the height of the irregularities 18 measured from a bottom of the irregularities 18 to a top of the irregularities.

With combined reference to FIGS. 1 and 2, a method of attaching the solar module 14 to the substrate 12 using the spacer 10 will now be described. First, the first release liner 26 is removed from the first adhesive layer 22. Then, the spacer 10 is pressed or rolled onto the top surface 16 of the substrate 12 between the irregularities 18. Alternatively, the spacer 10 may be placed overtop the irregularities 18. As noted above, the spacer 10 has a width that approximately matches the distance between adjacent irregularities 18 and a height greater than the top of the irregularities 18. The second release liner 28 is then removed from the second adhesive layer 24 in order to expose the second adhesive layer 24. Finally, the solar module 14 is pressed or rolled across one or more spacers 10 and the second adhesive layer 24 adheres to the solar module 10. Using the exemplary adhesive composition described above, the adhesive layers 22, 24 cure once the solar module 14 has been installed.

In an alternate embodiment, the release liners 26, 28 are not employed. Instead, the first adhesive layer 22 is applied to the substrate 12 between the irregularities 18, either in a tape form or applied as a semi-liquid or liquid paint. Next, the spacer layer 20 is applied to the first adhesive layer 22. The second adhesive layer 24 is then applied to the spacer layer 20, again either as a tape or as a semi-liquid or liquid paint. Then, the solar module 14 is secured to the second adhesive layer 24. In still another embodiment, the second adhesive layer 24 may be applied to the solar module 14 or be replaced with an adhesive layer that comes integrated with the solar module 14.

The spacer 10, when applied in intervals across a rigid solar module 14, allows air to circulate between the solar module 14 and the substrate 12, e.g. between the irregularities 18 and the solar module 14. Moreover, the spacer layer 20 can be easily cut between the substrate 12 and the solar module 14 if the solar module 14 must be removed or replaced. The spacer 10 also allows for some movement of the solar module 14 relative to the substrate 12 due to thermally or mechanically induced stresses. Finally, the spacer 10 prevents slight irregularities in the substrate 12 from causing stress in the solar module 10.

The description of the invention is merely exemplary in nature and variations that do not depart from the gist of the invention are intended to be within the scope of the invention. Such variations are not to be regarded as a departure from the spirit and scope of the invention.

The following is claimed:
1. An assembly for securing a solar module to a roofing substrate, the roofing substrate having at least one pair of parallel, spaced apart ridges, the assembly comprising:
a spacer having a top surface and a bottom surface, wherein the spacer has a first dimension equal to a distance between one of the pair of ridges and another of the pair of ridges and the spacer has a second dimension greater than a distance between a bottom of the at least one pair of ridges and a top of the at least one pair of ridges;

a first adhesive layer having a first surface and a second surface, wherein the first surface is in contact with at least a portion of the top surface of the spacer and the second surface is in contact with at least a portion of the solar module;

a second adhesive layer having a first surface and a second surface, wherein the first surface is in contact with at least a portion of the bottom surface of the spacer and the second surface is in contact with at least a portion of the roofing substrate; and wherein the assembly is disposed between the at least one pair of ridges to adhere the solar module to the roofing substrate; and wherein the first and second adhesive layers comprise:

an uncured rubbery polymer blend present in an amount from about 10% to about 60% by weight;

at least one of a compatible tackifier present in an amount from about 5% to about 25% by weight or a curing agent blend present in an amount from about 1% to about 5% by weight, the compatible tackifier comprising a phenolic tackifier resin, the curing agent blend comprising at least one of a cure accelerator, a sulfur activator, and a curing vulcanizing agent; and a polybutene homopolymer present in an amount from about 20% to about 60% by weight.

2. The assembly of claim 1 wherein the first dimension is measured perpendicularly between a first side surface of the spacer and a second side surface of the spacer.

3. The assembly of claim 1 wherein the second dimension is measured perpendicularly between the top surface and the bottom surface of the spacer.

4. The assembly of claim 1 wherein the first adhesive layer fully covers the top surface of the spacer and the second adhesive layer fully covers the bottom surface of the spacer.

5. The assembly of claim 1 wherein the second adhesive layer is adhered to the substrate and the first adhesive layer is adhered to the solar module.

6. The assembly of claim 1 wherein the spacer is comprised of at least one of ethylene propylene diene terpolymer, polypropylene, or a polyvinyl chloride.

7. The assembly of claim 1 wherein the first and second adhesive layers have a composition that comprises an uncured rubbery polymer blend, at least one tackifier or a curing agent blend, and a polybutene homopolymer.

8. An assembly for securing a solar module to a roofing substrate, the roofing substrate having at least one pair of parallel, spaced apart ridges, the assembly comprising:

a spacer having a top surface and a bottom surface, wherein the spacer has a first dimension less than a distance between one of the pair of ridges and another of the pair of ridges and the spacer has a second dimension greater than a distance between a bottom of the at least one pair of ridges and a top of the at least one pair of ridges;

a first adhesive layer having a first surface and a second surface, wherein the first surface is in contact with at least a portion of the top surface of the spacer and the second surface is in contact with at least a portion of the solar module;

a second adhesive layer having a first surface and a second surface, wherein the first surface is in contact with at least a portion of the bottom surface of the spacer and the second surface is in contact with at least a portion of the roofing substrate, wherein the first and second adhesive layers each comprise:

an uncured rubbery polymer blend present in an amount from about 10% to about 60% by weight;

at least one of a compatible tackifier present in an amount from about 5% to about 25% by weight or a curing agent blend present in an amount from about 1% to about 5% by weight, the compatible tackifier comprising a phenolic tackifier resin, the curing agent blend comprising at least one of a cure accelerator, a sulfur activator, and a curing vulcanizing agent; and a polybutene homopolymer present in an amount from about 20% to about 60% by weight, and wherein the assembly is disposed between the at least one pair of ridges to adhere the solar module to the roofing substrate.

9. The assembly of claim 8 wherein the first dimension is measured perpendicularly between a first side surface of the spacer and a second side surface of the spacer.

10. The assembly of claim 8 wherein the second dimension is measured perpendicularly between the top surface and the bottom surface of the spacer.

11. The assembly of claim 8 wherein the first adhesive layer fully covers the top surface of the spacer and the second adhesive layer fully covers the bottom surface of the spacer.

12. The assembly of claim 8 wherein the second adhesive layer is adhered to the substrate and the first adhesive layer is adhered to the solar module.

13. The assembly of claim 8 wherein the spacer is comprised of at least one of ethylene propylene diene terpolymer, polypropylene, or a polyvinyl chloride.

* * * * *